(12) United States Patent
Anderl et al.

(10) Patent No.: US 10,390,457 B2
(45) Date of Patent: Aug. 20, 2019

(54) NORMALLY OPEN ANTI-RECIRCULATION SYSTEM

(71) Applicant: International Business Machines Corporation, Armonk, NY (US)

(72) Inventors: William J. Anderl, Rochester, MN (US); Scott A. Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 15/091,601

(22) Filed: Apr. 6, 2016

(65) Prior Publication Data
US 2017/0295673 A1    Oct. 12, 2017

(51) Int. Cl.
H05K 7/20    (2006.01)

(52) U.S. Cl.
CPC ..... *H05K 7/20181* (2013.01); *H05K 7/20727* (2013.01)

(58) Field of Classification Search
CPC . F24F 13/15; F24F 11/04; H05K 7/20; H05K 7/20736; H05K 7/20181; H05K 7/20709
USPC .............. 454/259, 184, 251, 237; 211/26
See application file for complete search history.

(56) References Cited

U.S. PATENT DOCUMENTS

| | | | | |
|---|---|---|---|---|
| 1,706,280 A * | 3/1929 | Dyer | ................ | F24F 13/15 110/175 A |
| 2,965,014 A * | 12/1960 | Lowery | ................ | F24F 11/053 454/256 |
| 5,277,658 A * | 1/1994 | Goettl | ................ | F24F 11/043 137/512.1 |
| 6,991,533 B2 * | 1/2006 | Tsai | ................ | H05K 7/2019 361/695 |
| 8,072,756 B1 * | 12/2011 | Janes | ................ | H05K 7/20909 361/695 |

(Continued)

FOREIGN PATENT DOCUMENTS

| | | |
|---|---|---|
| GB | 2354819 A | 4/2001 |
| WO | 2009083052 A1 | 7/2009 |
| WO | 2015098478 A1 | 7/2015 |

OTHER PUBLICATIONS

O'Brien et al., "Utilities", Handbook of Chlor-Alkali Technology, vol. I: Fundamentals, Chapter 12, pp. 1169-1216, Copyright 2005.

*Primary Examiner* — Steven B McAllister
*Assistant Examiner* — Ko-Wei Lin
(74) *Attorney, Agent, or Firm* — Peter J. Edwards

(57) ABSTRACT

A frame having a perimeter defines a planar opening. A set of louvers may span from a first edge of the opening to a second edge of the opening. Each louver may be capable of rotating between a closed position and an open position. A set of physical obstructions may prevent the louvers from rotating beyond the open position. Each louver may be offset from the planar opening by a first acute angle when in a closed position, and by a second, larger, acute angle when in the open position. A flow of air in a first direction through the opening may rotate the set of louvers to the closed position. A flow air in the opposite direction through the opening may rotate the set of louvers to the open position such that the flow of air in the opposite direction moves freely through the opening.

17 Claims, 5 Drawing Sheets

(56) References Cited

U.S. PATENT DOCUMENTS

| | | | |
|---|---|---|---|
| 2001/0046838 A1* | 11/2001 | Hertel | F24F 13/1406 454/259 |
| 2003/0091433 A1 | 5/2003 | Tam et al. | |
| 2004/0217072 A1* | 11/2004 | Bash | H05K 7/20718 211/26 |
| 2004/0240177 A1 | 12/2004 | Suzuki et al. | |
| 2005/0249587 A1 | 11/2005 | Paulsen | |
| 2008/0268764 A1 | 10/2008 | Cruz et al. | |
| 2013/0260665 A1* | 10/2013 | Sun | H05K 7/20181 454/184 |
| 2013/0327507 A1 | 12/2013 | Degner et al. | |
| 2016/0295718 A1* | 10/2016 | Khzouz | H05K 5/0213 |

* cited by examiner

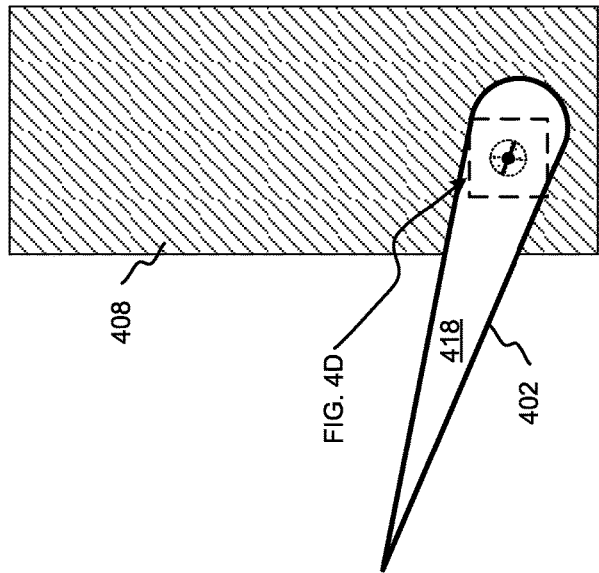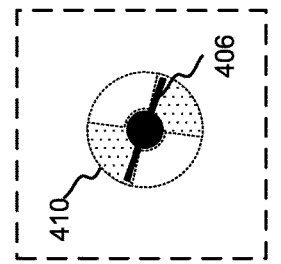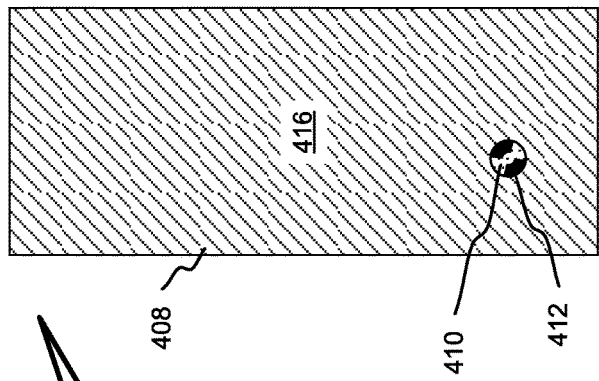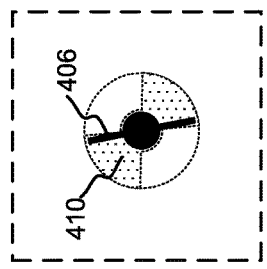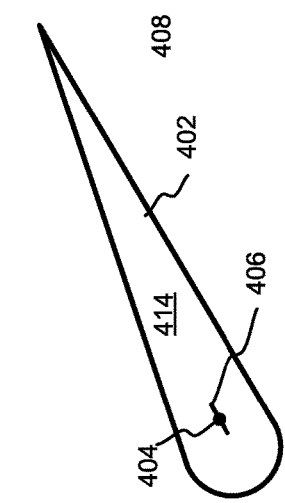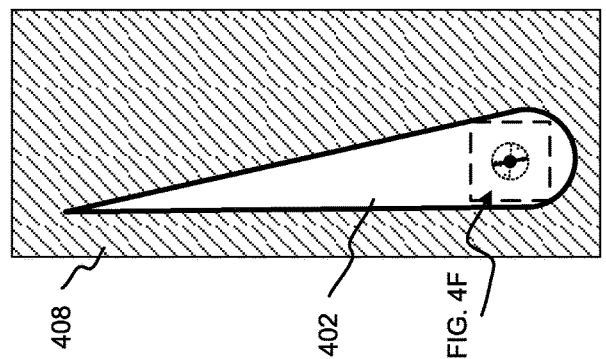

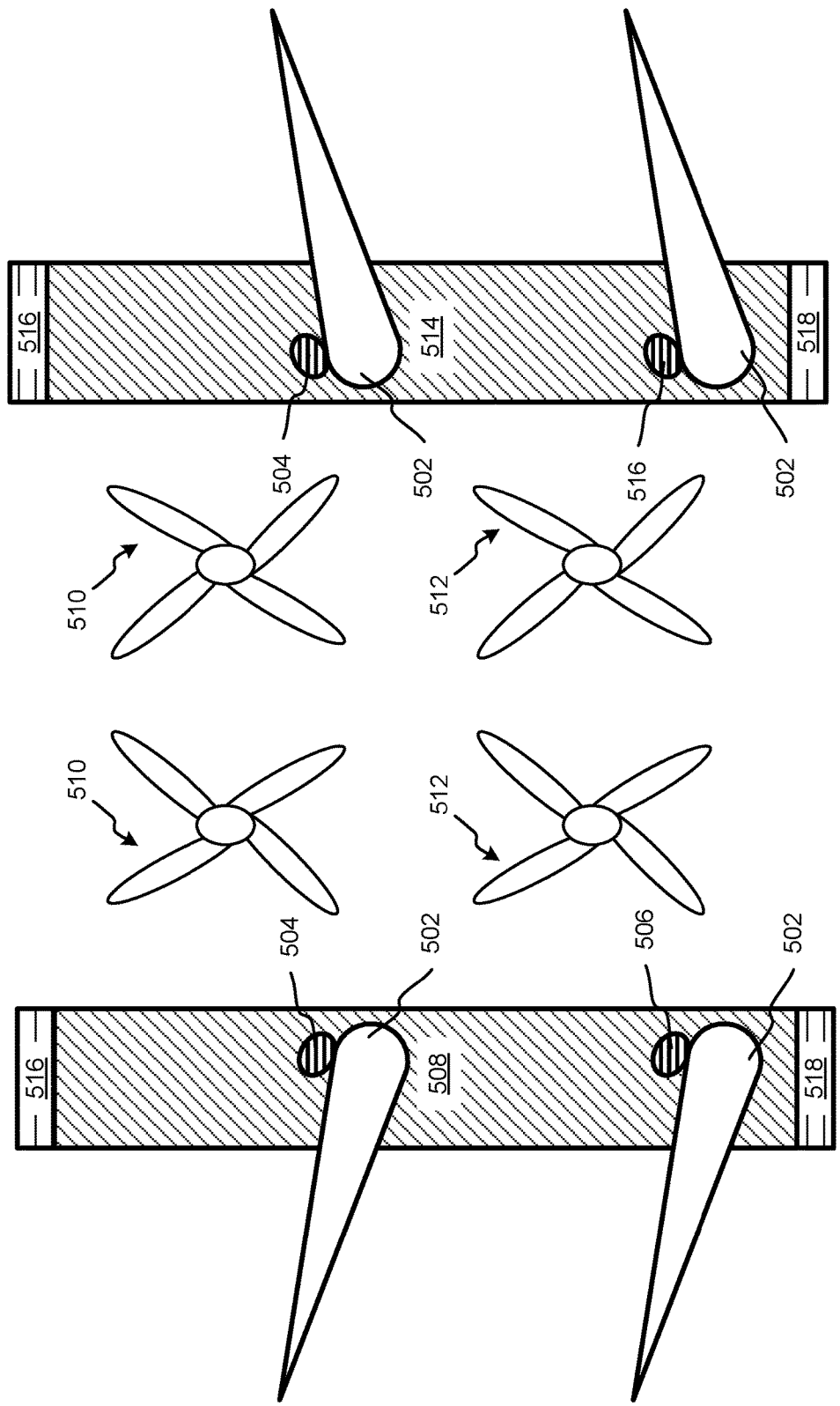

NORMALLY OPEN ANTI-RECIRCULATION SYSTEM

BACKGROUND

Aspects of the present disclosure relate to ventilation systems, more particular aspects relate to preventing recirculation in ventilation systems.

Typical ventilation systems utilize louvers or flexible flaps to block ventilation openings to prevent recirculation. These louvers or flaps may remain in a closed position unless moved, rotated, or deformed by a force of air provided by an associated fan or blower.

SUMMARY

Some embodiments of the present disclosure can be illustrated by an anti-recirculation apparatus. The apparatus may comprise a frame having a perimeter that defines a planar opening within the frame. The apparatus may also comprise a set of louvers that each span from a first edge to an opening to an opposite edge of the opening, and each louver may be pivotally connected to the frame such that each louver is capable of rotating within a range between a closed position and an open position. The apparatus may also comprise a set of physical obstructions that obstruct the rotation of the louvers such that the physical obstructions prevent each louver from rotating beyond the open position. Each louver is offset from the planar opening by a first acute angle when in the closed position and offset from the planar opening by a second, larger acute angle when in the open position. A flow of air in a first direction through the opening rotates the set of louvers from the open position to the closed position. Finally, A flow of air in a second direction through the opening, opposite the first direction, rotates the set of louvers from the closed position to the open position, such that the flow of air in the second direction moves freely throughout the opening.

Some embodiments of the present disclosure can also be illustrated by a method of using a louver system in a server component compartment. In the method, a set of louvers may be allowed to rotate from a closed position to an open position. The set of louvers may be prevented from rotating past the open position by a physical obstruction located within the path of rotation of each louver in the set of louvers. The method may also comprise causing an air-circulation mechanism to push air in a first direction through a vent in which the set of louvers is installed, such that the air exits the vent into the server component compartment. Finally, the method may comprise allowing the air-circulation mechanism to cease pushing air through the vent, wherein a positive air pressure inside the compartment causes the set of louvers to rotate from the open position to the closed position upon the air-circulation mechanism ceasing, and wherein each louver in the set of louvers will remain in the open position upon the air-circulation mechanism ceasing in the absence of a positive pressure inside the component compartment.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 4A illustrates a louver on which a travel-stop mechanism has been incorporated, in accordance with embodiments.

FIG. 4B illustrates a vent frame with a recess with which a travel-stop mechanism may interface, in accordance with embodiments.

FIG. 4C illustrates a normally open louver system in the open position and with a travel-stop mechanism incorporated into the louver-frame connection, in accordance with embodiments.

FIG. 4D illustrates a magnified section of FIG. 4C for ease of understanding.

FIG. 4E illustrates a normally open louver system in the closed position and with a travel-stop mechanism incorporated into the louver-frame connection, in accordance with embodiments.

FIG. 4F illustrates a magnified section of FIG. 4E for ease of understanding.

FIG. 5A depicts a cross-sectional representation of a normally open louver system viewed from one side, in accordance with embodiments.

FIG. 5B depicts a cross-sectional representation of a normally open louver system viewed from a second side, in accordance with embodiments.

Figure 1:
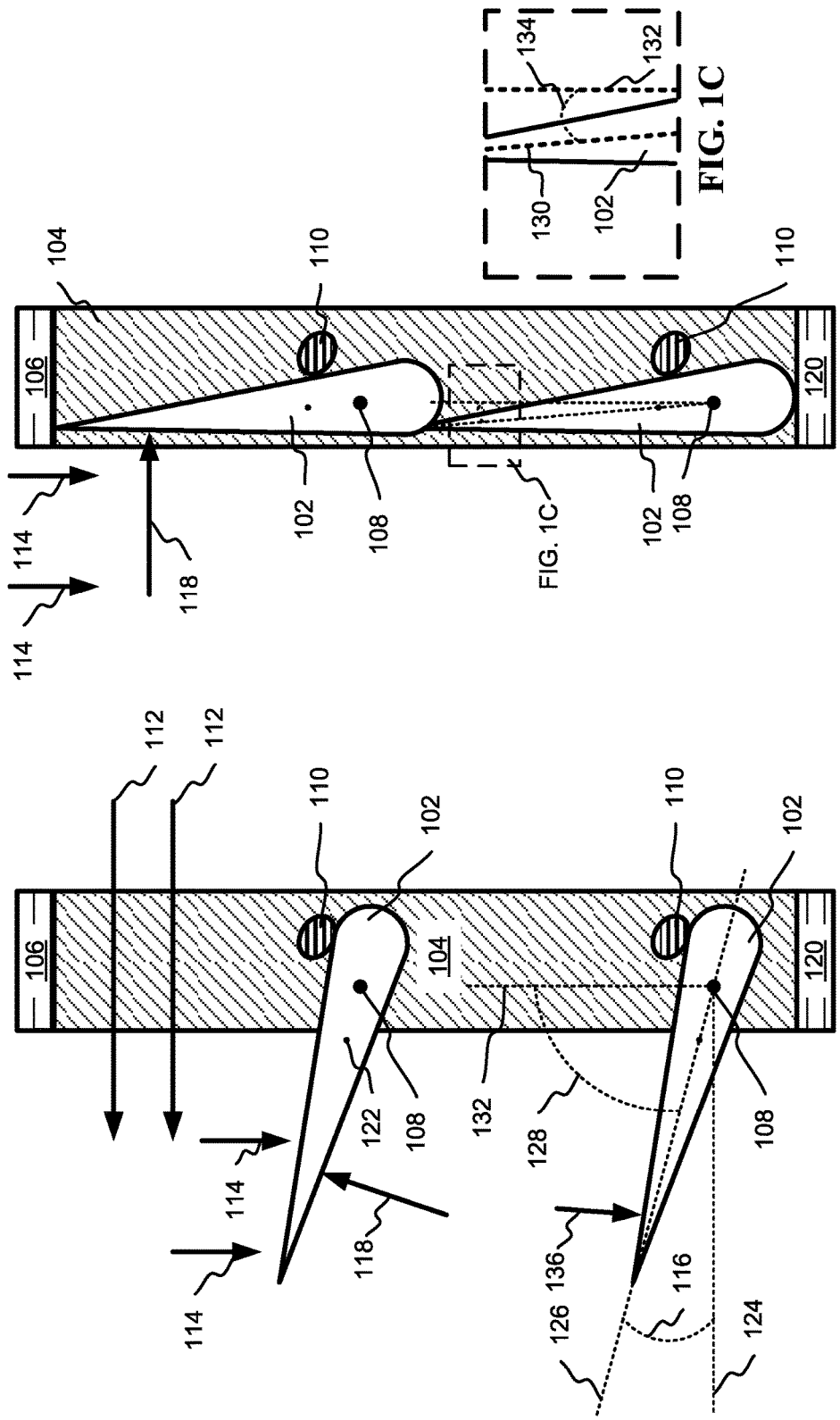
FIG. 1A depicts a cross-sectional representation of a normally open louver system in the open position, in accordance with embodiments.
FIG. 1B depicts a cross-sectional representation of a normally open louver system in the closed position, in accordance with embodiments.
FIG. 1C depicts a magnified section of FIG. 1B for ease of understanding.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to ventilation systems, more particular aspects relate to preventing recirculation in ventilation systems. While the present disclosure is not necessarily limited to such applications, various aspects of the disclosure may be appreciated through a discussion of various examples using this context.

Some systems for cooling computer systems use air-circulation mechanisms, such as fans or blowers, to direct airflow to the heatsinks of the heat-sensitive components of the computer systems. Some large computer systems, such as server computers, use multiple air-circulation mechanisms to supply air for a single compartment of components. These cooling systems may create a state of positive air pressure inside the component compartment. This positive pressure may cause air inside the compartment to exit through any escape holes available. Cooling systems may take advantage of this by designing component compartments with escape holes that are deliberately placed to control airflow in a direction from the air-circulation mechanisms and towards, and past, the heatsinks of heat-sensitive components before exiting the compartment. By controlling the airflow inside a compartment, the efficiency of the cooling for the components in the compartment may be increased. Note that, for the sake of simplicity, the term "blower" will be used herein in place of "air-circulation mechanism." Unless otherwise stated, the term "blower" should be interpreted to describe any mechanism for deliberately forcing a source of air through a vent frame, such as a blower or fan.

Some cooling systems for large computer systems utilize redundant blowers so the system may continue to operate if one blower fails or needs to be stopped. For example, some large computer systems may utilize enough blowers to enable the computer system to operate at a full or reduced workload even if one or more blowers fail, but may not produce enough heat to require all blowers to be operating during low-workload processes or periods of short operation. For example, a server system may have periods during the day during which the data in the server is not processed frequently, and thus the components that may otherwise require cooling (e.g., processors and memory) may not produce significant heat. That server may also have periods during the day during which it is running at full workload and producing a significant amount of heat, yet is still able to operate without all blowers running. In instances in which a computer system operates with some, but not all, blowers operating, a positive air-pressure environment may still be created in the component compartment. In these instances, air in the component compartment may be forced into the vents of the non-operating blowers (referred to herein as "recirculation"), which may limit the amount of air that flows over the heatsinks of components and out designed exit holes.

Some computer-cooling systems utilize solutions to block the vent or vents of non-operating blowers in order to prevent recirculation into the vents. Some such solutions utilize flaps that block air from flowing into the vent when the blower is not operating, but that the blower displaces (e.g., rotates or bends) when the blower is operating, allowing air to flow from the blower, through the vent, and into the component compartment. When the blower is not forcing the flaps open, the flaps return to a closed position (i.e., the natural, resting position of the flaps is a closed position in which the flaps obstruct the vent opening). For example, some such flaps may be closed by gravity (e.g., horizontally oriented rotating louvers that are rotated up against gravity by the blower) or material tension of the flap (e.g., flexible plastic flaps that are bent out of place by the blower). Some solutions may also have mechanisms by which the flaps are prevented from being pushed into the vent by recirculating air (e.g., cross bars or screens in the vent directly behind the flaps).

While some solutions utilizing normally closed vent flaps may be effective at preventing recirculation, the energy expended by the blower maintain the flaps in an open position (i.e., a non-resting position) may reduce blower efficiency. As the energy that is required to maintain an open position increases, the blower efficiency typically decreases. This can also prevent effective utilization of energy-efficiency modes of operation in which blowers are operated below their maximum power (i.e., running slowly). These modes may be beneficial for reducing the electricity required to operate the blowers and to reduce the noise created by the blowers. However, blowers running at these low-power modes may force the vent flap open less than a blower running at full speed. Thus the vent flaps may block far more of the vent opening in a low-power mode, which may in turn prevent effective circulation of air into a component chamber. This limits the cooling benefits of the blower, and thus a computer system running at even a moderate load may generate far too much heat for the blower to cool in a low-power mode. Thus, low-power blower modes may be unusable in some normally closed vent-flap cooling systems, unless the computer system is running at a very low workload and producing very moderate heat.

Further, normally closed vent flaps may continually push against the airflow exiting a blower vent even at full blower speed, which may cause the flap to flutter. This fluttering may further decrease blower efficiency and create unintended, non-optimal irregularities in airflow patterns in the component compartment. Finally, flaps pushing against a blower's airflow may redirect the air to undesirable portions of the component compartment (e.g., under a mounted rack or motherboard).

Some embodiments described in the present disclosure may improve upon anti-recirculation technology in cooling systems by utilizing flaps (referred to herein as "louvers") that are normally open. These normally open louvers may not rely on the force of a corresponding blower to maintain an open position, and thus may result in higher blower efficiency than previous solutions while still preventing recirculation. For example, a horizontally oriented (i.e., a louver that rotates about an axis that is oriented in a vertical plane) normally open louver may be rotated "down" by a force applied by the acceleration of gravity, and may rely on a positive pressure from inside the component compartment to close the louver (i.e., rotate the louver "up") when its blower fails or is stopped. Alternatively, a vertically oriented (i.e., a louver that rotates about an axis that is oriented in a horizontal plane) normally open louver may not be affected by the acceleration of gravity, but may be stable in the open position as long as no positive pressure inside the component compartment is forcing it shut.

One embodiment of a normally open louver system is illustrated in FIGS. 1A-1C. FIGS. 1A and 1B are cross-sectional representations of a vent frame that forms a perimeter around Louvers 102. Thus, Vertical Section 104 represents a surface of the inner perimeter of the frame, Top Horizontal Section 106 represents a cross-sectional surface of the top of the frame, and Bottom Horizontal Section 120 represents a cross-sectional surface of the bottom of the frame. Vertical Section 104, Top Horizontal Section 106, Bottom Horizontal Section 120, and a second vertical section parallel and opposite to Vertical Section 104 (omitted in this figure) together define a planar opening of the vent through which a blower may force air.

Louvers 102 are pivotally connected to Vertical Section 104 of the vent frame at Pivot Points 108. Louvers 102 may span the horizontal width of this planar opening from Vertical Section 104 to the omitted vertical section. In this embodiment, Louvers 102 each have a Center of Mass 122 located to the left of and above their respective Pivot Points 108. Thus, the force applied by the acceleration of gravity would tend to cause Louvers 102 to rotate into the open position (i.e., to rotate counter clockwise in this illustration, moving Center of Mass 122 in a downward direction). The acceleration of gravity is illustrated here by Gravity Vectors 114. The force applied by Gravity Vectors 114 and would which would be distributed between a vector parallel to Bisecting Line 126 (in a downward direction) and perpendicular to Bisecting Line 126 (in a downward direction) The perpendicular force vector would have a tendency to open Louvers 102. In this open position, airflow from a blower to which the louver system is connected may pass through the system (i.e., may flow freely through the planar opening), as shown by Airflow Vectors 112. Airflow Vectors 112 may provide an auxiliary force against Louvers 102, aiding the force applied by Gravity Vectors 114 in keeping Louvers 102 in an open position. However, because Louvers 102 are not actively pushing against Airflow Vectors 112, this auxiliary force does not significantly affect blower, or airflow, efficiency in this embodiment. Note that, while Airflow Vectors 112 are shown only above a single Louver 102 for the ease of understanding. In other embodiments airflow may flow equally through the entire planar opening, or at different rates in different sections of the opening based on, for example, blower type.

In this embodiment, Travel Stops 110 are attached to Vertical Section 104 in the path of rotation of the broad end of Louvers 102, preventing further rotation. In this embodiment, Travel Stops 110 stop Louvers 102 at Angle 116 above Horizontal Axis 124. Angle 116 is a representation of the degree to which Center of Mass 122, bisected by Bisecting Axis 126, is rotated above Pivot Point 108, bisected by Horizontal Axis 124. When Angle 116 reaches 0 degrees, Center of Mass 122 will be located on Horizontal Axis 124 with Pivot Point 108. Note that this may also be expressed in terms of the angle between Bisecting Axis 126 and Axis 132, which is parallel to the Gravity Vectors 114. Such an angle is represented in FIG. 1A by Angle 128. Angle 128 may be an accurate representation of the relative positions of Center of Mass 122 and Pivot Point 108 with respect to Horizontal Axis 124. In this embodiment, Axis 132 is also parallel to the planar opening defined by the perimeter of the vent frame.

In this embodiment the louver system of FIGS. 1A & 1B may be installed with several other similar louver systems into a server, such that all louvers open into and all blowers blow into the component compartment. In such an embodiment, if no blowers were operating, Gravity Vectors 114 would continue to apply force to Louvers 102, tending to push Center of Mass 122 downward, and thus keeping Louvers 102 in an open position. The blowers could then be turned on and off without being required to open (or keep open) Louvers 102, which would in turn conserve energy of Airflow Vectors 112, causing more efficient operation and more airflow directed into the component compartment.

However, if only some blowers were operating, positive air pressure would still build up in the component compartment. For example, the blower corresponding to Louvers 102 may fail, but all other blowers may remain operating. The air pressure built up in the component compartment applies a force normal to the surfaces of Louvers 102, represented by Pressure Vector 118 (which, pushing on the bottom surface of Louver 102, would have a tendency to close Louver 102) in FIGS. 1A and 1B and by Pressure Vector 136 (which, pushing on the top surface of Louver 102, would have a tendency to keep Louver 102 open) in FIG. 1A. In this embodiment, if Angle 128 is less than 90 degrees, Pressure Vector 118 would be greater than Pressure Vector 136, and the overall effect of the air pressure inside the component chamber would be to close Louver 102. If the difference in force applied by these pressure vectors (i.e., in this embodiment, the amount by which Pressure Vector 118 exceeds Pressure Vector 136) is greater than the force applied by Gravity Vectors 114, Louvers 102 will close, illustrated by Louvers 102 in FIG. 1B. By adjusting the open angle of Louvers 102 (i.e., Angle 128), the surface area of Louvers 102, the mass of Louvers 102, and the distance between Pivot Point 108 and center of Mass 122, the it is possible that a very small difference in force applied by the pressure vectors may be sufficient to close Louvers 102.

In their closed position, Lovers 102 together span the vertical distance between Top Horizontal Section 106 and Bottom Horizontal Section 120. Because Louvers 102 also span the horizontal width from Vertical Section 104 to the omitted vertical section that is parallel to and opposite of Vertical Section 104, Louvers 102 effectively block the entire planar space defined by the perimeter formed by the vent frame. Thus, Louvers 102 prevent recirculation in their closed position. In this embodiment there is also a slight overlap where the two Louvers 102 meet. This overlap may help to block airflow in the vent opening. In some embodiments the overlap may not be present but the vent may still be completely or significantly blocked by the louvers. In other embodiments the overlap may be greater, which may increase the blocking capability of the louvers or decrease the tolerance to which the louvers and louver connection points may be manufactured.

If the blower associated with Louvers 102 were reactivated, Airflow Vectors 112 would begin to apply a force to Louvers 102, which, in some embodiments, would be sufficient, together with the force applied by Gravity Vectors 114, to overcome the force applied by Pressure Vectors 118 and open Louvers 102 (note that, in this embodiment, Pressure Vector 136 is not present when Louvers 102 completely block the opening of the vent frame in their closed position). Further, in this embodiment Travel Stops 110 are again in Louvers' 102 paths of rotation. Travel Stops 110 thus prevent Louvers 102 from rotating to a point at which Gravity Vectors 114 would be unable to open them once Pressure Vectors 118 disappeared (or decreased sufficiently), and the blower were not reactivated (e.g., to a point at which Center of Mass 122 were directly above Pivot Point 108).

This can be seen more directly in FIG. 1C. In FIG. 1C, Louver 102 is shown in the closed position also represented in FIG. 1B. Bisecting Line 130 crosses through Pivot Point 108 and Center of Mass 122. Axis 132 is parallel to Gravity Vectors 114, and is parallel to the planar opening of the vent in this embodiment. Angle 134 represents the difference between Bisecting Line 130 and Axis 132. In this embodiment, as Angle 134 decreases (i.e., Louver 102 closes), the force applied by Gravity Vectors 114 will have less of a tendency to reopen Louver 102. If Angle 134 becomes small enough (e.g., zero degrees or less), Gravity Vectors 114 may be unable to reopen Louver 102 when all blowers are deactivated (i.e., Pressure Vectors 118 disappear). In some embodiments for example, Louver 102 may be composed of heavy materials (e.g., metal), in which case Gravity Vectors 114 may be sufficient to open Louver 102 as long as Angle 134 is greater than zero degrees. However, Louver 102 is composed of light materials, the effect of Gravity Vectors 114 on Louver 102 may be overcome by other environmental forces (e.g., ambient air pressure and friction in Pivot Point 108) at small angles, in which case Angle 134 may need to be larger (e.g., 30 degrees). Similar to FIG. 1A, as the distance along Bisecting Line 130 between Center of Mass 122 and Pivot Point 108 increases, Angle 134 may be smaller (e.g., 2 degrees) while still permitting the perpendicular force applied by Gravity Vectors 114 to open Louver 102. Further, as other environmental forces such as ambient pressure and friction are reduced, Gravity Vectors 114 will be able to close Louver 102 at a smaller Angle 134. Similar to Angle 116 and 128, Angle 134 may be controlled by shifting the position of Travel Stop 110. In some embodiments, Angle 134 may be substantially smaller than Angle 128 in order to create sufficient airflow when Louvers 102 are in the "open" position and create sufficient air blockage when Louvers 102 are in the "closed" position.

In some embodiments the force of the blower activating (e.g., Airflow Vectors 112) may be powerful enough to reopen Louvers 102 even if Angle 134 is very near −90 degrees (e.g., when the tapered end of Louver 102 is pointing toward the blower). However, allowing Louvers 102 to open into the vent frame may reduce the amount of the vent frame that is blocked by Louvers 102. Thus, in these embodiments, the optimal value of Angle 134 may depend less on the ability of Gravity Vectors 114 to open Louvers 102 when Louvers 102 are in their closed position and more on the percentage of the vent opening that is blocked by Louvers 102 when Louvers 102 are in their closed position (and by extension, the effectiveness of Louvers 102 at preventing recirculation).

In the embodiment illustrated by FIGS. 1A and 1B, whether the difference in force applied by Pressure Vectors 118 and 136 would exceed the force applied by Gravity Vectors 114 would be affected by the position of Center of Mass 122 relative to Pivot Point 108 and by the extent to which the Louvers 102 are permitted to open by Travel Stops 110. For example, the farther Louvers 102 are permitted to open by the position of Travel Stops 110, the greater the force applied by Gravity Vectors 114 will be on Louvers 102 when they are fully open, and the less the difference in force applied by Pressure Vectors 118 and 136 will be on Louvers 102. On the other hand, the closer that Center of Mass 122 is to Pivot Point 108 along Bisecting Axis 126 (even if Center of Mass 122 is not located on Bisecting Axis 126), the smaller the force applied by Gravity Vectors 114 will be. In other words, as Angle 116 gets closer to zero degrees (i.e., as Angle 128 gets closer to ninety degrees), Pressure Vectors 118 will be less able to overcome Gravity Vectors 114 unless Pivot Point 108 is shifted closer to Center of Mass 122 or Center of Mass 122 is shifted closer to Pivot Point 108. In some embodiments Pivot Point 108 may be shifted, during design of or manufacture of the Louver, closer to or farther from Center of Mass 122 in order to increase or decrease the moment of inertia of Louver 102 and Louver 102. For example, Pivot Point 108 in FIGS. 1A and 1B are shifted closer to the center of mass of Louvers 102 than the pivot point in typical normally closed louver systems, which often pivot at or close to one of the ends of the louver. In other embodiments the same effect may be attained by changing the shape or material composition of the louver to shift its center of mass.

In some embodiments, the difference in force applied by Pressure Vectors 118 and 136 may be sufficient to overcome Gravity Vectors 114 if Angle 128 is eighty-five degrees or less. In some embodiments any amount below ninety degrees (e.g., eighty-eight degrees, seventy degrees) may be sufficient, but an angle close to ninety degrees may be chosen to maximize airflow through the planar opening. This is because, while Gravity Vectors 114 and Pressure Vectors 118 may be capable of opening and closing Louvers 102 at a very small Angle 128 (e.g., 30 degrees), airflow though the vent may be reduced at smaller values of Angle 128. However, in some embodiments, smaller angles may be necessary. For example, in some embodiments Louvers 102 may be constructed from heavy materials (e.g., metal instead of plastic), causing a smaller Angle 128 (e.g., forty-five degrees) to be necessary to ensure that Pressure Vectors 118 are sufficient to close Louvers 102. In other embodiments it may be beneficial to shift Pivot Point 108 to the very extreme point of the broad end of Louvers 102. This may locate Pivot Point 108 significantly far away from Center of Mass 102, and, particularly in horizontally-oriented embodiments, create a need for a smaller Angle 128. The precise number may vary based on the materials used to construct Louvers 102, the shape of Louvers 102, and the position of Pivot Points 108 on Louvers 102.

In some embodiments Louvers 102 may be oriented vertically, rather than horizontally. In some such embodiments Gravity Vectors 114 would not tend to push Louvers 102 or Louvers 102 open. However, in some embodiments Airflow Vectors 112 would be of greater magnitude than Pressure Vectors 118, and have a greater effect on Louvers 102 and Louvers 102. In these embodiments the air from the blower would keep the louvers open when the blower was operating. Further, when all blowers were shut off, no significant force vectors would be causing the louvers to rotate, and thus they would remain in their last state (e.g., "open" for Louvers 102 and "closed" for Louvers 102). However, when only the blower associated with Louvers 102 shut off, Airflow Vectors 112 would disappear, but a positive pressure may still build in the component compartment and apply a force to Louvers 102. This force, represented by Pressure Vectors 118, would tend to close the louvers, represented by Louvers 102.

Because Gravity Vectors 114 may not have an effect in vertically oriented embodiments, there may be benefits to decrease Angle 116 close to zero degrees (i.e., increase Angle 128 close to ninety degrees). As Angle 128 approaches ninety degrees in this embodiment, the airflow produced by the corresponding blower may be less obstructed by the blower, resulting in more efficient operation. However, at the same time the difference between Pressure Vectors 118 and 136 may decrease, reducing the closing force of the air pressure on Louver 102. Depending on the mass of the materials used to construct Louver 102, the distance between Pivot Point 108 and Center of Mass 122, the surface area of Louver 102 exposed to Pressure Vector 118, etc., the opening effect applied by Gravity Vectors 114 may be greater, in some horizontally oriented embodiments, than the closing effect of the air pressure in the component chamber. However, in vertically oriented embodiments, the difference between Pressure Vectors 118 and 136 is not directly counter balanced by Gravity Vectors 114. Depending on the friction between components and the moment of inertia of the louvers, this may enable the positive air pressure inside the component compartment to close Louvers 102 when Angle 128 is extremely close to ninety degrees (e.g., 89.9999 degrees).

The effect of Pressure Vectors 118 and 136 may also be increased by increasing the surface area of Louvers 102 that are exposed to the positive pressure inside the component chamber. In this embodiment, increasing the surface area of Louvers 102 will tend to increasing the surface area of Louvers 102 will increase the force applied to Louvers 102 by the positive pressure inside the component chamber. Thus, the same force may be applied to a smaller pressure by increasing the surface area. It is possible that increasing the surface area may also increase the mass of Louvers 102, which would also increase the effect of Gravity Vectors 114 on Louvers 102. This increased effect may be larger if Louvers 102 are composed of heavy materials (e.g., a dense metal) rather than a light material (e.g., a hollow plastic matrix).

Figure 2:
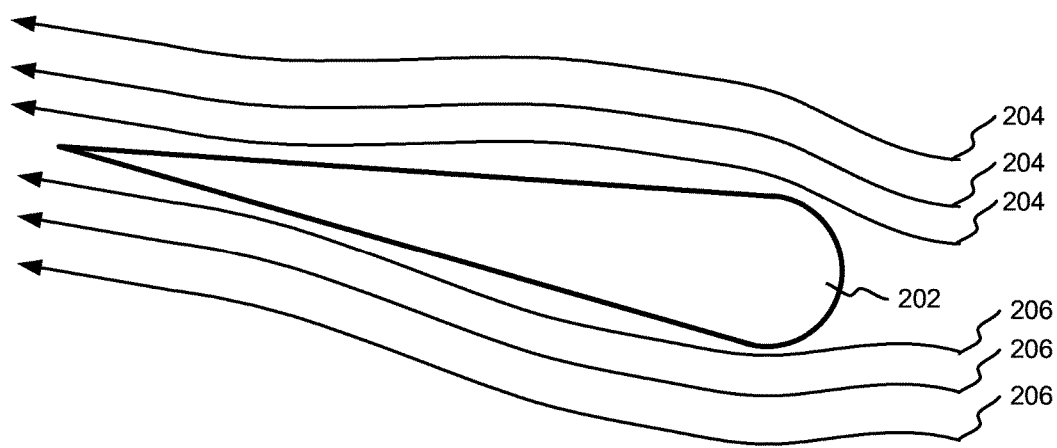
FIG. 2 illustrates one embodiment of a louver in an airfoil shape, in accordance with embodiments.

In some embodiments, either horizontally or vertically oriented, the normally open louvers may be more stable during blower operation than normally closed louvers (i.e., the normally open louvers may flutter less). This may be due in part to the airflow from the blower not constantly fighting the louver's natural tendency to close, and also because the louvers may be resting against a travel stop. This stability may lead to more predictable airflow patterns over the louver, permitting designers to take advantage of different louver shapes for different benefits. FIG. 2 illustrates one embodiment of the present disclosure in which a particular airfoil shape is utilized for the louver. Louver 202 may be installed in a blower vent and in an open position, with the tapered end pointing outward into a component compartment of a server. Louver 202 has been designed in a symmetrical airfoil shape in order to smooth airflow passing through a vent, though in some embodiments non-symmetrical airfoils may be used. Airflow Lines 204 and 206 may represent the airflow being driven by a blower. Airflow Lines 204 represent air flowing over Louver 202 and directed slightly upward into the component compartment by Louver 202's shape and angle. Similarly, Airflow Lines 206 represent air flowing under Louver 202 and directed in a similar upward trajectory. This airfoil shape creates smooth airflow lines, which reduce turbulence and make airflow more predictable.

The broad end of Louver 202 is presented, in this embodiment, as approximately a section of a circular. However, in other embodiments a more elliptical curve may be more efficient at reducing the coefficient of drag of the object. For example, as the orientation of Louver 202 gets closer to parallel to the direction in which the blower is pushing air (e.g., as Angle 128 in FIG. 1A approaches ninety degrees), a narrower, more elliptical curve, rather than a circular curve, may be beneficial.

The airfoil shape of Louver 202 may improve performance of the embodiments discussed herein, but it is not essential to any embodiment. However, the airfoil shape may be particularly beneficial to the normally open embodiments discussed herein because of the stability provided by travel stops that keep the louver from opening too far. As opposed to louvers that open against the acceleration of gravity or the tensile forces of the louver material, for example, normally open louvers secured by travel stops may remain in one position, without fluttering or oscillating, during normal operation. With this stability and predictability, an airfoil shape can be designed and taken advantage of. If, on the other hand, the louver were constantly fluttering and oscillating up and down (e.g., as the force of the blower airflow fought against the acceleration of gravity or the tensile forces of the louver material), the any benefits of the airfoil shape would likely be reduced (or entirely prevented) by the turbulence caused by the constant louver movement.

The stability of louvers in the present disclosure also may lead to decreased wear and tear on the components used to connect the louvers to a vent frame (e.g., a pin-and-socket pivot mechanism). When louvers flutter and oscillate between various open positions (e.g., while gravity or tensile forces push against a blower's airflow), the connection components may be subjected to friction forces that may tend to break down the connection components. This may lead to a louver connection pin breaking or freezing inside its socket, causing louver failure. Because the louvers presented in this disclosure may be stable in the open position (e.g., when the louver's blower is operating) and stable in the closed position (e.g., when the louver's blower has failed), very little wear and tear may occur. Thus, the life of the louver system may be significantly extended.

Figure 3:
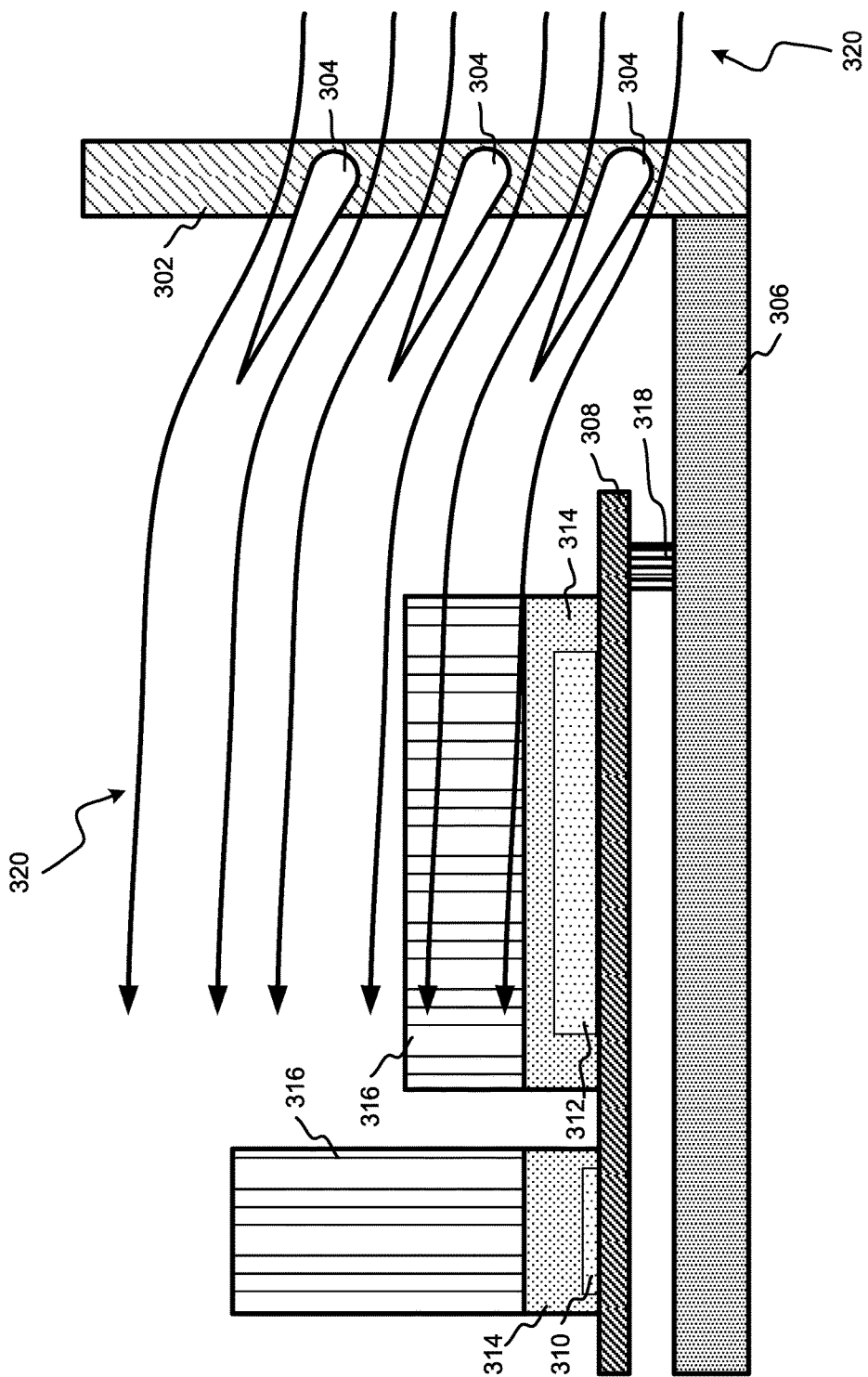
FIG. 3 illustrates a component compartment in which a normally open louver system is installed, in accordance with embodiments.

In some embodiments of the present disclosure, the predictability and stability of normally open louvers may be used to direct airflow from a blower towards components that may require the most cooling (e.g., mains processor, service processor, PCI adapter, storage controller and memory heat sinks). Such an embodiment is illustrated in FIG. 3. Blower Vent 302 contains a set of three Louvers 304, each of which is configured as a horizontally oriented normally open airfoil louver. Note that in some embodiments, Blower Vent 302 may contain a different number of louvers in the set (as used herein, a "set" refers to one or more). Blower Vent 302 is connected to Housing 306 of a server component compartment. The component compartment contains Motherboard 308, which holds Processor 310 and Memory 312. Each of Processor 310 and Memory 312 is coupled to a block of Heatsink Base 314, which is in turn coupled to Heatsink Fins 316. Motherboard 308 is connected to and separated from Housing 306 with Standoff 318.

When the blower is operating or when no blowers in the compartment are operating, Louvers 304 are stable in the open position, as shown. Airflow Lines 320 represent the approximate path air from the blower would take when pushed through Blower Vent 302. Because Louvers 304 are tilted with the tapered end pointed up, Airflow Lines 320 are directed in an upward path when exiting the vent. This is aided by the airfoil shape of Louvers 304, as discussed in connection with FIG. 2. In this embodiment Airflow Lines 320 begin to flatten as they become more influenced by being drawn to the exit holes in the component compartment, located to the left of the figure in this embodiment. This path causes air to flow up above both Heatsink Bases 314, which may normally block airflow, and through Heatsink Fins 316. Further, airflow tends to be directed above Motherboard 308. This may be beneficial in many embodiments because it may prevent air from becoming trapped in or flowing in the space between Motherboard 308 and Housing 306.

In some embodiments of the present disclosure Louvers 304 may be stable in the open position as long as additional blowers are contributing airflow to the component compartment while the blower associated with Vent 302 fails. For example, if all blowers are off, Louvers 304 may be stable in the open position due to gravity. If all blowers are then turned on, the pressure inside the chamber may increase, but the airflow from the blower associated with Vent 302 may overcome the pressure, causing Louvers 304 to remain open. However, if the blower associated with Vent 302 fails or is shut off while other blowers continue to operate, the positive pressure in the component chamber may overcome gravity's effects on Louvers 304 and force them into a closed position.

The stable position of Louvers 304, combined with the airfoil shape, also makes the airflow represented by Airflow Lines 320 more stable and predictable. With travel stops installed, the position of louvers may be known with a high degree of precision. Further, the lack of flutter may prevent airflow from being directed inconsistently, and the airfoil shape may prevent turbulence and drag. For these reasons designers of component compartments, may rely on airflow predictions with higher confidence when basing component placement on those predictions.

In some embodiments of the present disclosure, the travel stop or stops that prevent a louver from opening too far may be physical obstructions of different forms. For example, the Travel Stops 110 presented in FIGS. 1A and 1B may take the form of a small bump that is affixed to Vertical Section 104. A similar bump may, in some embodiments, also be affixed to the omitted vertical section, or a single bump may be used. In some embodiments the travel stop may not be a bump, but a horizontal bar that extends from one vertical section of the vent frame to the other. In some embodiments different configurations of travel stops may have different effects on the efficiency of air flow around the louver. For example, a travel stop bar that spans a vent-frame opening may reduce airflow efficiency more than a small travel-stop bump. In yet other embodiments, a stop may be incorporated into the pivot point of a louver, which may eliminate the airflow-efficiency effects of the travel stop.

FIGS. 4A-4F depict an embodiment of a louver in which a travel stop is incorporated into a pivot-point mechanism. Louver 402 has Pivot Point 404, which is shown in FIG. 4A by a black circle that protrudes from Louver Surface 414. Pivot Point 404 may take the form of, for example, a fastening pin, bar, or rod. In some embodiments Pivot Point 404 may be inserted into a corresponding recess to secure Louver 402 inside a vent frame. Extending from two opposite sides of Pivot Point 404 are Travel Stop Bars 406, which may protrude from Louver Surface 414 by a similar amount to Pivot Point 404. In this embodiment Travel Stop Bars 406 are depicted as approximately parallel with a line that would bisect Louver 402, but in other embodiments other orientations may be utilized.

Louver 402 may be inserted into a blower vent frame. Vertical Frame Section 408, illustrated in FIG. 4B, represents one section of such a vent frame. Vertical Frame Section 408 contains Pivot Recess 410, a recess in Frame Surface 416 into which Pivot Point 404 and Travel Stop Bars 406 may be inserted. Pivot Recess 410 contains two Protrusions 412, which may protrude from Pivot Recess 410 to a similar degree that Pivot Recess 410 is recessed into Frame Surface 416 such that each Protrusion 412 may be flush with Frame Surface 416. In some embodiments Protrusions 412 may be designed to block the rotation of Travel Stop Bars 406 at predetermined angles to prevent Louver 402 from opening or closing past a predetermined amount.

The function of the travel-stop mechanism may be viewed in FIGS. 4C-4F. In FIG. 4C Louver 402 has been coupled to Vertical Frame Section 408 such that Louver Surface 414 and Frame Surface 416 are adjacent and facing each other. In some embodiments the depth of Pivot Recess 410 may be slightly less the height of Pivot Point 404 such that Louver Surface 414 and Frame Surface 416 do not directly contact each other. This may eliminate friction between Louver 402 and Vertical Frame Section 408.

Louver Surface 418 is opposite of Louver Surface 414. In some physical implementations Louver Surface 418 may have a coupling-and-travel-stop mechanism similar to that shown on Louver Surface 414 (e.g., including a connecting pin similar to Pivot Point 404), or any similar option.

In FIG. 4C Louver 402 is shown in the open position (i.e., the "resting" position). The travel stop mechanism in FIG. 4C is displayed in a larger size in FIG. 4D. Travel Stop Bars 406, identifiable by the white dots at their ends, are located at the approximate left and right sides of Pivot Recess 410. As is shown, this may prevent Louver 402 from opening to ninety degrees past the planar opening defined by the vent frame (i.e., this may maintain an acute angle between Louver 402 and the planar opening). In FIG. 4E, Louver 402 is shown in the closed position. The travel stop mechanism in FIG. 4E is displayed in a larger size in FIG. 4F. Travel Stop Bars 406 are located at the approximate top and bottom of Pivot Recess 410. As is shown, this may prevent Louver 402 from closing to zero degrees from the planar opening defined by the vent frame (i.e., this may maintain at least an acute angle between Louver 402 and the planar opening).

In some embodiments the travel-stop mechanism illustrated in FIGS. 4A-4F may improve airflow efficiency by eliminating any non-louver obstructions between the blower and the vent frame opening. The depicted travel-stop mechanisms are meant as examples and are not intended to limit the embodiments of the present disclosure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

FIGS. 5A-5B depict a cross-sectional representation of a normally open louver system viewed from opposite sides. FIGS. 5A and 5B are cross-sectional representations of a vent frame that forms a perimeter around Louvers 502. Thus, Vertical Section 508 represents a surface of the inner perimeter of the frame, Top Horizontal Section 516 represents a cross-sectional surface of the top of the frame, and Bottom Horizontal Section 518 represents a cross-sectional surface of the bottom of the frame. Vertical Section 508, Top Horizontal Section 516, Bottom Horizontal Section 518, and Second Vertical Section 514, which is parallel and opposite to Vertical Section 508 (omitted in FIG. 5A, but illustrated in FIG. 5B) together define a planar opening of the vent through which Air-Circulation Mechanisms 510 and 512 may force air.

Louvers 502 are pivotally connected to Vertical Section 508 of the vent frame. Louvers 502 span the horizontal width of this planar opening from Vertical Section 508 to Second Vertical Section 514 (omitted in FIG. 5A, but illustrated in FIG. 5B).

In this embodiment, Travel Stop Bar 504 and Travel Stop Bump 506 are attached to Vertical Section 508 in the path of rotation of the broad end of Louvers 502, preventing further rotation. In this embodiment the louver system of FIGS. 5A & 5B may be installed with several other similar louver systems into a server, such that all louvers open into and all air-circulation mechanisms blow into the component compartment.

FIG. 5A illustrates a cross-sectional representation of the vent frame viewed from a first perspective (i.e., the perspective from which a Vertical Surface 508 may be viewed). FIG. 5B, however, illustrates a cross-sectional representation of the vent frame viewed from a second perspective (i.e., the perspective from which a Vertical Surface 514 may be viewed). Thus, in FIG. 5B, Vertical Surface 514 is illustrated, and Vertical Surface 508 is not omitted. A person of skill in the art, however, would understand that these omissions are due to the nature of cross-sectional illustrations, and that both FIGS. 5A & 5B are intended to disclose an illustration of a frame with four sides.

FIG. 5B illustrates Travel Stop Bar 504, which is the same object as Travel Stop Bar 504 illustrated in FIG. 5A. Travel Stop Bar 504 is a horizontal bar that extends from one vertical section of the vent frame to the other. Thus, like Louvers 502, Travel Stop Bar 504 spans the horizontal width of this planar opening from Vertical Section 508 to Vertical Section 514. In other words, Travel Stop Bar 504 represents a travel stop bar that spans a vent-frame opening.

FIG. 5B also illustrates Travel Stop Bump 516, which is not the same object as Travel Stop Bump 506. Travel Stop Bump 506 takes the form of a small bump that is affixed to Vertical Section 508. Travel Stop Bump 516 is a similar bump that is affixed to Vertical Section 514.

FIGS. 5A & 5B illustrate Air-Circulation Mechanisms 510 and 512. The first air-circulation mechanism, Air-Circulation Mechanisms 510, may be, for example, any mechanism for deliberately forcing a source of air through a vent frame, such as a blower or fan. The second circulation mechanism, Air-Circulation Mechanisms 512, may also be, for example, any mechanism for deliberately forcing a source of air through a vent frame, such as a blower or fan. Further, while FIGS. 5A & 5B are illustrated here with multiple air-circulation mechanisms, a person of skill in the art would understand that a vent frame may be capable of operating with only one air-circulation mechanism.

In this embodiment the louver system of FIGS. 5A & 5B may be installed with several other similar louver systems into a server, such that all louvers open into and all air-circulation mechanisms blow into the component compartment.

What is claimed is:

1. An apparatus comprising:
   a frame having a perimeter that defines a planar opening within the frame;
   a set of louvers spanning from a first edge of the opening to an opposite edge of the opening, each louver pivotally connected to the frame such that each louver is capable of rotating within a range between a closed position and an open position;
   a set of physical obstructions, the set of physical obstructions obstructing the rotation of the set of louvers such that the set of physical obstructions prevents the set of louvers from rotating beyond the open position;
   wherein each louver of the set of louvers is offset at a first acute angle to the planar opening in the closed position and offset at a second acute angle from the planar opening in the open position, the second acute angle being greater than the first acute angle;
   wherein a flow of air in a first direction through the opening rotates the set of louvers from the open position to the closed position;
   wherein a flow of air in a second direction opposite of the first direction through the opening rotates the set of louvers from the closed position to the open position such that the flow of air in the second direction moves freely through the opening;
   wherein the set of louvers remains in the open position in the absence of a flow of air in the first direction through the opening and in the second direction through the opening; and
   wherein each louver in the set of louvers is in an airfoil shape.

2. The apparatus of claim 1, wherein each louver in the set of louvers spans from the first edge of the opening to the opposite edge of the opening in a horizontal orientation.

3. The apparatus of claim 1, wherein each louver in the set of louvers spans from the first edge of the opening to the opposite edge of the opening in a vertical orientation.

4. The apparatus of claim 1, wherein the set of physical obstructions comprises a first bump on a first surface of the frame within the opening.

5. The apparatus of claim 4, wherein the set of physical obstructions comprises a second bump on a second surface of the frame within the opening, wherein the second surface is opposite the first surface with respect to the opening.

6. The apparatus of claim 1, wherein a physical obstruction in the set of physical obstructions is located within a mechanism by which a louver in the set of louvers is pivotally connected to the frame.

7. The apparatus of claim 1, wherein a physical obstruction in the set of physical obstructions is an elongated member spanning the opening from the first surface of the frame within the opening to the second surface of the frame within the opening.

8. The apparatus of claim 1, wherein the second acute angle is greater than 45 degrees.

9. A method of using a louver system in a server component compartment, the server compartment comprising a frame having a perimeter that defines a planar opening within the frame, the method comprising:
   allowing a set of louvers in the louver system to rotate from a closed position towards an open position;
      wherein each louver in the set of louvers is offset at a first acute angle to the planar opening in the closed position and offset at a second acute angle from the planar opening in the open position, the second acute angle being greater than the first acute angle; and
      wherein each louver in the set of louvers is in an airfoil shape;
   preventing a particular louver in the set of louvers from rotating past the open position with a corresponding physical obstruction located within the path of rotation of the particular louver in the set of louvers;
   causing an air-circulation mechanism to push air in a first direction through a vent in which the set of louvers is installed, such that the air exits the vent into the server component compartment;
   allowing the air-circulation mechanism to cease pushing air through the vent, wherein a positive air pressure inside the component compartment causes the set of louvers to rotate from the open position to the closed position upon the air-circulation mechanism ceasing, wherein the corresponding physical obstruction prevents the particular louver in the set of louvers from rotating past the closed position, and wherein the set of louvers remain in the open position upon the air-circulation mechanism ceasing in the absence of a positive air pressure inside the component compartment.

10. The method of claim 9, wherein the set of louvers rotate about an axis that is oriented in a horizontal plane.

11. The method of claim 9, wherein the set of louvers rotate about an axis that is oriented in a vertical plane.

12. The method of claim 11, wherein the set of louvers remain in the open position in the absence of a positive air pressure due to gravity's interaction with each louver in the set of louvers.

13. The method of claim 11, wherein a center of mass of each louver in the set of louvers is located at a pre-determined distance from a pivot point of each louver, the location at the pre-determined distance causing gravity's interaction with each louver to tend to rotate the louver to the open position.

14. The method of claim 13, wherein each louver in the set of louvers has a pre-determined surface-area size that causes the positive air pressure's interaction with each louver to overpower gravity's interaction with each louver when the air-circulation mechanism ceases.

15. The method of claim 13, wherein each louver in the set of louvers has a pre-determined mass that causes the positive air pressure's interaction with each louver to overpower gravity's interaction with each louver when the air-circulation mechanism ceases.

16. The method of claim 9, wherein the open position is pre-determined to maximize the distance between the open position and the closed position and to enable the positive air pressure inside the compartment to close the set of louvers when the air-circulation mechanism ceases.

17. An apparatus comprising:
- a frame having a perimeter that defines a planar opening within the frame;
- a set of louvers spanning from a first edge of the opening to an opposite edge of the opening, each louver pivotally connected to the frame such that each louver is capable of rotating within a range between a closed position and an open position, wherein a flow of air in a first direction through the opening rotates the set of louvers from the open position to the closed position and a flow of air in a second direction opposite of the first direction through the opening rotates the set of louvers from the closed position to the open position such that the flow of air in the second direction moves freely through the opening;
- a set of physical obstructions, the set of physical obstructions obstructing the rotation of the set of louvers such that the set of physical obstructions prevents the set of louvers from rotating beyond the open position;
- a component compartment into which the frame is installed, such that the flow of air moving freely in the second direction through the opening flows into the component compartment;
- a first air-circulation mechanism configured to push air through the opening in the second direction when the first air-circulation mechanism is activated;
- at least a second air-circulation mechanism configured to push air into the component compartment when activated, wherein the at least the second air-circulation mechanism creates a positive air pressure in the component compartment when pushing air into the component compartment, and wherein the second air-circulation mechanism does not push air through the opening in the second direction;
- wherein each louver of the set of louvers is offset at a first acute angle to the planar opening in the closed position and offset at a second acute angle from the planar opening in the open position, the second acute angle being greater than the first acute angle;
- wherein the set of louvers remains in the open position in the absence of a flow of air in the first direction through the opening and in the second direction through the opening;
- wherein the positive air pressure causes the set of louvers to move from the open position to the closed position when the first air-circulation mechanism is not activated; and
- wherein each louver in the set of louvers is in an airfoil shape.

* * * * *